(12) United States Patent
Zhang et al.

(10) Patent No.: US 11,375,607 B2
(45) Date of Patent: Jun. 28, 2022

(54) MIRRORED VOLTAGE REGULATOR FOR HIGH-CURRENT APPLICATIONS AND METHOD THE SAME

(71) Applicant: Apple Inc., Cupertino, CA (US)

(72) Inventors: Kejiu Zhang, Los Gatos, CA (US); Sunil M. Akre, Santa Clara, CA (US)

(73) Assignee: APPLE INC., Cupertino, CA (US)

( * ) Notice: Subject to any disclaimer, the term of this patent is extended or adjusted under 35 U.S.C. 154(b) by 211 days.

(21) Appl. No.: 16/551,303

(22) Filed: Aug. 26, 2019

(65) Prior Publication Data

US 2020/0315000 A1   Oct. 1, 2020

Related U.S. Application Data

(60) Provisional application No. 62/825,336, filed on Mar. 28, 2019.

(51) Int. Cl.
| H05K 1/02 | (2006.01) |
| H05K 1/18 | (2006.01) |
| H02M 7/00 | (2006.01) |
| H05K 7/20 | (2006.01) |

(52) U.S. Cl.
CPC .......... *H05K 1/0231* (2013.01); *H02M 7/003* (2013.01); *H05K 1/0203* (2013.01); *H05K 1/0233* (2013.01); *H05K 1/181* (2013.01); *H05K 7/209* (2013.01); *H05K 2201/1003* (2013.01); *H05K 2201/10015* (2013.01); *H05K 2201/10166* (2013.01); *H05K 2201/10545* (2013.01)

(58) Field of Classification Search
CPC .. H05K 7/02; H05K 7/06; H05K 7/08; H05K 7/10; H05K 1/11; H05K 1/14; H05K 1/16; H05K 1/18; H02M 3/15; H02M 3/158; H02M 3/1584; H02M 7/00
USPC ......... 361/760–764, 780–784, 795, 807–810
See application file for complete search history.

(56) References Cited

U.S. PATENT DOCUMENTS

| | | | | |
|---|---|---|---|---|
| 5,973,923 | A * | 10/1999 | Jitaru | H01F 27/06 165/185 |
| 7,145,782 | B2 * | 12/2006 | Searls | H01L 23/49844 361/780 |
| 7,304,857 | B2 * | 12/2007 | Yamashita | H05K 1/181 361/760 |
| 8,344,842 | B1 * | 1/2013 | Luzanov | H01F 41/02 336/192 |
| 8,528,190 | B2 * | 9/2013 | Lotfi | H01F 41/005 29/602.1 |
| 2004/0015199 | A1 * | 1/2004 | Thompson | A61N 1/3758 607/36 |
| 2007/0030641 | A1 | 2/2007 | Hall et al. | |

(Continued)

FOREIGN PATENT DOCUMENTS

KR   10-1089398   12/2011

*Primary Examiner* — Tuan T Dinh
(74) *Attorney, Agent, or Firm* — BakerHostetler (57) ABSTRACT

The disclosed technology relates to a power supply circuit that utilizes a double-sided printed circuit board (PCB) that has a first surface and a second surface. The second surface is disposed opposite the first surface. Mounted on the first surface is a first power stage and a first inductor. Mounted on the second surface is a second power stage and a second inductor. The second power stage is disposed opposite the first power stage. The second inductor is disposed opposite the first inductor.

14 Claims, 4 Drawing Sheets

(56) References Cited

U.S. PATENT DOCUMENTS

| | | | |
|---|---|---|---|
| 2009/0175014 A1* | 7/2009 | Zeng | H01F 27/2804 |
| | | | 361/782 |
| 2014/0355218 A1* | 12/2014 | Vinciarelli | B29C 45/14639 |
| | | | 361/728 |
| 2015/0282370 A1* | 10/2015 | Yang | H01F 5/00 |
| | | | 361/736 |
| 2015/0372597 A1* | 12/2015 | Luo | H02M 3/1588 |
| | | | 323/271 |
| 2017/0025961 A1* | 1/2017 | Seeman | H02M 3/1584 |
| 2017/0248996 A1* | 8/2017 | Zhang | H02M 3/1584 |
| 2018/0138810 A1* | 5/2018 | Hattori | H02M 7/48 |
| 2018/0294720 A1* | 10/2018 | Zhu | G01K 3/005 |
| 2019/0037700 A1* | 1/2019 | Tange | H05K 5/065 |

\* cited by examiner

MIRRORED VOLTAGE REGULATOR FOR HIGH-CURRENT APPLICATIONS AND METHOD THE SAME

PRIORITY

This application claims the benefit under 35 U.S.C. § 119(e) of U.S. Provisional Patent Application Ser. No. 62/825,336, entitled "MIRRORED VOLTAGE REGULATOR FOR HIGH-CURRENT APPLICATIONS," filed on Mar. 28, 2019, which is incorporated herein by reference in its entirety.

TECHNICAL FIELD

The present disclosure relates generally to power supplies, and more particularly, to a high density, multi-phase mirrored voltage regulator for high-current applications.

BACKGROUND

Voltage regulators are used in a wide variety of circuits in order to provide a regulated output voltage to particular circuits. In high-current applications, voltage regulators may be implemented in a multi-phase architecture and in stages. Each of the stages may contribute to generating the output voltage based on supplied input voltage (e.g. from an external source). The stages may be coupled to one another, with capacitors coupled to the output of each stage. These capacitors may stabilize the voltage that is output by each of the stages. Generally, as certain applications may require higher current, a number of voltage regulators arranged on a printed circuit board or PCB may be increased. An increase in a number of voltage regulators, however, may result in increased acoustic noise, electromagnetic noise, and/or operating temperatures that impact user experience.

SUMMARY

The disclosed embodiments provide for a power-supply that includes a double-sided printed circuit board comprising a first surface and a second surface disposed opposite the first surface, a first power stage mounted to the first surface of the PCB, a second power stage mounted to the second surface of the PCB opposite the first power stage, a first inductor mounted to the first surface of the PCB, and a second inductor mounted to the second surface of the PCB opposite the first inductor. During operation, the first and second inductors each produce electromagnetic noise in opposing phases resulting in the cancellation of the noise generated by the first and second inductors.

The disclosed embodiments provide for an electronic device that uses a plurality of multi-phase voltage regulators for providing power to the electronic device. Each voltage regulator includes a double-sided printed circuit board comprising a first surface and a second surface disposed opposite the first surface, a first power stage mounted to the first surface of the PCB, a second power stage mounted to the second surface of the PCB opposite the first power stage, a first inductor mounted to the first surface of the PCB, and a second inductor mounted to the second surface of the PCB opposite the first inductor. During operation, the first and second inductors each produce electromagnetic noise in opposing phases resulting in the cancellation of the noise generated by the first and second inductors. During operation, each of the plurality of multi-phase voltage regulators provide current at a common target output voltage to a load of the electronic device.

In some embodiments, a method for increasing a power density of a power-supply circuit is disclosed. The method includes mounting a first power stage on a first surface of a double-sided printed circuit board. The first power stage has a first pin arrangement. The method also includes mounting a second power stage on a second surface of the PCB opposite the first surface. The second power stage has a second pin arrangement that is mirrored to the first pin arrangement. The method further includes mounting a first inductor to the first surface of the PCB, and mounting a second inductor to the second surface of the PCB. During operation, the first and second inductors each produce electromagnetic noise in opposing phases resulting in the cancellation of the noise generated by the first and second inductors.

BRIEF DESCRIPTION OF THE DRAWINGS

The embodiments herein may be better understood by referring to the following description in conjunction with the accompanying drawings in which like reference numerals indicate identical or functionally similar elements. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

A conventional voltage regulator may generate 50-60 amperes (Amps) per phase. In applications requiring 300-400 Amps, voltage regulators may be arranged side-by-side on a printed circuit board or PCB in a 6-8 phase configuration. Arranging voltage regulators side-by-side, however, results in an increased footprint within devices. In applications requiring higher current, such as 600 Amps or more, increasing the number of voltage regulators arranged sideby-side on a surface of a PCB may not be possible due to limited physical space within electronic devices, and may further affect user experience via increases in acoustic noise, electromagnetic noise, and/or operating temperature.

The disclosed technology addresses the foregoing limitations of conventional power-supply circuits by mirroring components of a voltage regulator on opposite or both sides of a PCB to increase packaging efficiency while reducing or canceling acoustic noise and/or electromagnetic noise. Specifically, because ceramic capacitors are prone to vibrate due to "Piezo-Electric" effect, when the vibration frequency is in audible range the resulting acoustic-noise may affect user experience. In one aspect, by mirroring ceramics capacitors on opposite or both sides of the PCB, vibration of the capacitors mitigated. In another aspect, because output filter inductors are also known to vibrate due to "Magnetostriction" phenomenon, mirroring output filter inductors on opposite or both sides of the PCB mitigates vibration. In addition, by increasing a contact area between the PCB and an inductor of the voltage regulator, acoustic noise caused by vibration of the inductor may be minimized or eliminated. Further, by partially or entirely surrounding the inductor with a shield and increasing a contact area between the PCB and the inductor, heat transfer from the PCB to the shield is improved to thereby more efficiently remove and manage heat generated by the voltage regulator while reducing electromagnetic interference.

Figure 1:
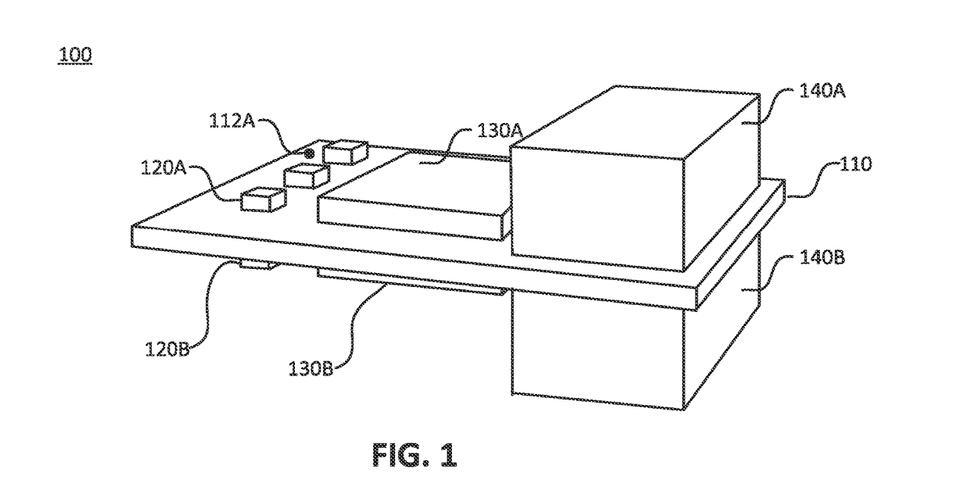
FIG. 1 illustrates a perspective view of a voltage regulator, in accordance with various aspects of the subject technology.

FIG. 1 illustrates a perspective view of a voltage regulator 100, in accordance with various aspects of the subject technology. The voltage regulator 100 may comprise a mirrored and horizontally symmetrical two-phase DC-DC power-supply circuit. Each phase of the two-phase voltage regulator 100 comprises a set of input and output capacitors, a power stage, and an inductor. Referring to FIG. 1, the voltage regulator comprises a double-sided PCB 110 with a first surface 112A and a second surface 112B that opposes the first surface 112A. Mounted on the first surface 112A of the PCB 110, are a first set of input and output capacitors 120A, a first power stage 130A, and a first inductor 140A. Mounted on the second surface 112B of the PCB 110, are a second set of input and output capacitors 120B, a second power stage 130B, and a second inductor 140B. The second set of capacitors 120B may be electrically coupled to the second surface 112B of the PCB 110 at a location that is directly opposite of the first set of capacitors 120A. The second power stage 130B may be electrically coupled to the second surface 112B of the PCB 110 at a location that is directly opposite of the first power stage 130A. The second inductor 140B may be electrically coupled to the second surface 112B of the PCB 110 at a location that is directly opposite of the first inductor 140A.

Figure 2:
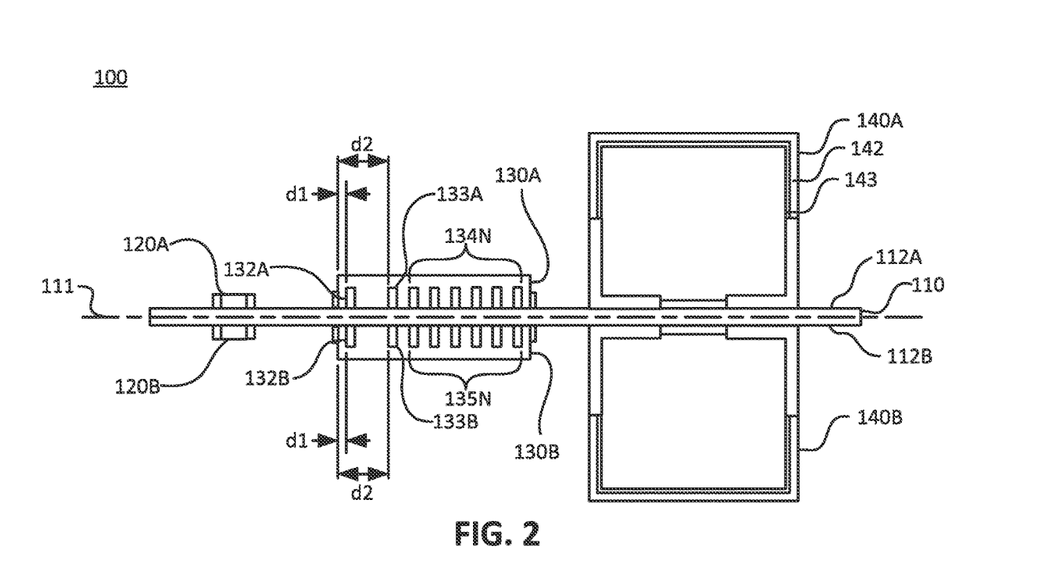
FIG. 2 illustrates a cross section view of a voltage regulator, in accordance with various aspects of the subject technology.

A first phase of the two-phase voltage regulator 100 may comprise the first set of capacitors 120A, the first power stage 130A, and the first inductor 140A. A second phase of the two-phase voltage regulator 100 may comprise the second set of capacitors 120B, the second power stage 130B, and the second inductor 140B. In some aspects, the components (e.g., the first set of capacitors 120A, the first power stage 130A, the first inductor 140A, the second set of capacitors 120B, the second power stage 130B, and the second inductor 140B) of the voltage regulator 100 are arranged on the first surface 112A and the second surface 112B in a mirrored configuration such that the voltage regulator 100 is symmetrical about a horizontal plane 111 (as shown in FIG. 2).

Figure 6:
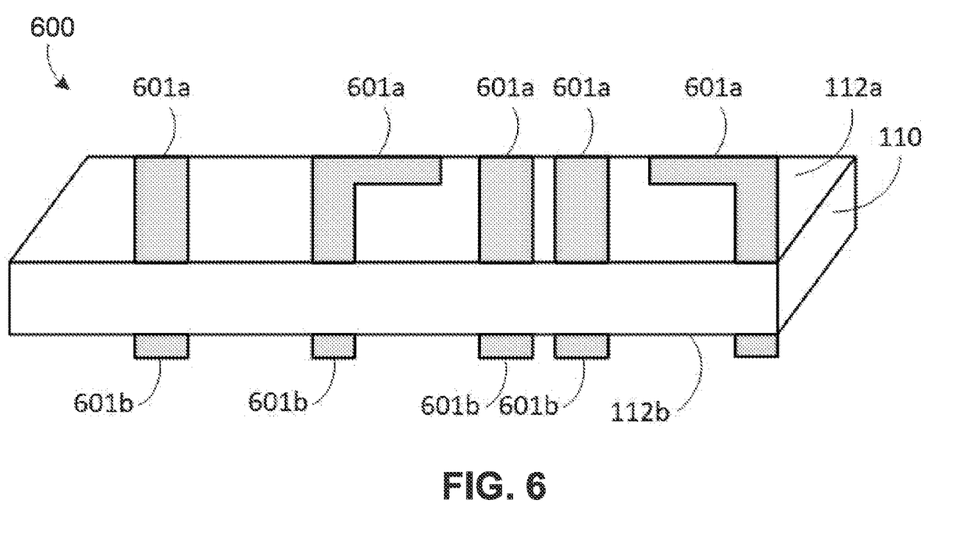
FIG. 6 illustrates a cross section view of an exemplary double-sided PCB.

FIG. 6 illustrates a cross section view of an exemplary double-sided PCB. A conductive pattern 601b disposed on the second surface 112B of the PCB 110 may be mirrored to a conductive pattern 601a disposed on the first surface 112A of the PCB 110. In some aspects, because the conductive pattern 601b of the second surface 112B of the PCB 110 is mirrored to the conductive pattern 601a disposed on the first surface 112A of the PCB 110, any electromagnetic noise generated by the voltage regulator 100 is canceled because the first surface 112A and the second surface 112B are each carrying the same amount of current, but in opposite directions, thereby resulting in their respective moments cancelling each other FIG. 2 illustrates a cross section view of the voltage regulator 100, in accordance with various aspects of the subject technology. As shown, the second set of capacitors 120B are mounted to the second surface 112B of the PCB 110 and may be disposed opposite of the first set of capacitors 120A that are mounted on the first surface 112A of the PCB 110. The second power stage 130B is mounted to the second surface 112B of the PCB 110 and may be disposed opposite of the first power stage 130A that is mounted on the first surface 112A of the PCB 110. The second inductor 140B is mounted to the second surface 112B of the PCB 110 and may be disposed opposite of the first inductor 140A that is mounted on the first surface 112A of the PCB 110.

In some aspects, because the second inductor 140B is mounted directly opposite of the first inductor 140A, any electromagnetic noise generated by the first and second inductors, 140A and 140B respectively, is canceled because during operation, the first inductor 140A and the second inductor 140B produce electromagnetic noise in opposing phases. In another aspect, because the second inductor 140B is mounted directly opposite of the first inductor 140A, vibration or acoustic noise generated by the first and second inductors, 140A and 140B respectively, is canceled because during operation, the first inductor 140A and the second inductor 140B vibrate in opposing phases.

Each of the first and second power stages, 130A and 130B respectively, may comprise an integrated circuit ("IC"), such as a switch (e.g., MOSFET), a driver, and any other semiconductors. In some examples, the first and second power stages, 130A and 130B respectively, may comprise a high-side MOSFET and/or a low-side MOSFET to facilitate a power conversion in voltage regulator 100. In one aspect a pin arrangement of the second power stage 130B is mirrored to a pin arrangement of the first power stage 130A. For example, referring to FIG. 2, the first power stage 130A may comprise a first pin 132A with a first functionality disposed a first distance d1 from a side of the first power stage 130A, a second pin 133A with a second functionality disposed a second distance d2 from the side of the first power stage 130A, and one or more pins 134N with one or more functionalities. The second power stage 130B may comprise a first pin 132B having the same first functionality as the first pin 132A of the first power stage 130A, a second pin 133B having the same second functionality as the second pin 133A of the first power stage 130A, and one or more pins 135N with one or more functionalities that are the same as the one or more functionalities as the pins 134N of the first power stage 130A. In one aspect, because the second power stage 130B is disposed opposite of the first power stage 130A, the first pin 132B of the second power stage 130B is disposed directly opposite of the first pin 132A of the first power stage 130A at the first distance d1 from the side of the first power stage 130A. In another aspect, because the second power stage 130B is disposed opposite of the first power stage 130A, the second pin 133B of the second power stage 130B is disposed directly opposite of the second pin 133A of the first power stage 130A at the second distance d2 from the side of the first power stage 130A. In yet another aspect, because the second power stage 130B is disposed opposite of the first power stage 130A, the one or more pins 135N of the second power stage 130B are disposed directly opposite of the one or more pins 134N of the first power stage 130A.

The first and second inductors, 140A and 140B respectively, may each comprise an outer shield 142 that partially or completely surrounds the first and second inductors, 140A and 140B respectively. The shield 142 may be formed of a heat conducting material, such as a metal alloy, and is configured to transfer heat away from the PCB 110. In one aspect, the shield 142 may further comprise a plurality of fins to increase dissipation of heat transferred from the PCB to the shield. In some aspects, a thermal conducting and electrically insulating insulator 143 may be disposed between the shield 142 and the first and second inductors, 140A and 140B respectively.

Figure 3:
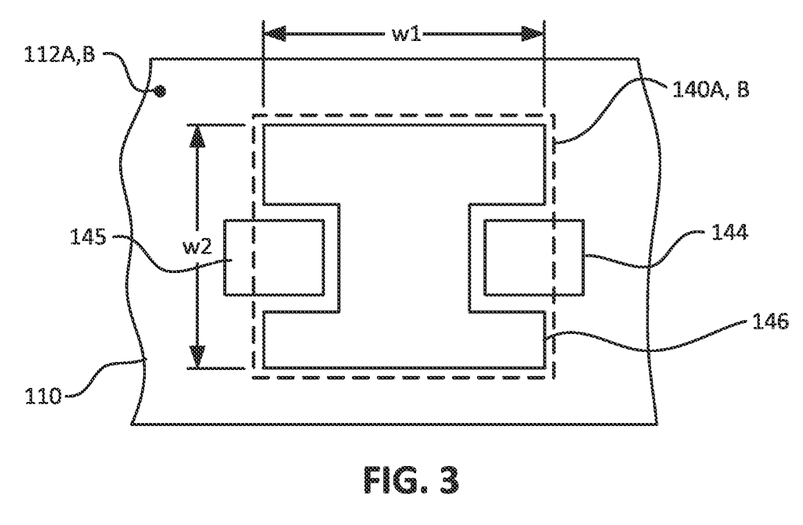
FIG. 3 illustrates a top view of an inductor mounting configuration on a printed circuit board, in accordance with various aspects of the subject technology.

FIG. 3 illustrates a top view of an inductor mounting configuration disposed on the PCB 110, in accordance with various aspects of the subject technology. An area for mounting the first inductor 140A is provided on the first surface 112A of the PCB 110 and an area for mounting the second inductor 140B is provided on the second surface 112B of the PCB 110. The area on the first and second surfaces, 112A and 112B respectively, may each comprise a first pad 144, a second pad 145, and a third pad 146. The first pad 144 and the second pad 145 are each configured to electrically connect to terminals of the first and second inductors, 140A and 140B respectively. The third pad 146 is configured to be soldered to a corresponding bonding surface disposed on a bottom portion of the shield 142 to increase a surface area of the shield 142 that is in direct contact with the PCB 110 to thereby dampen vibration and reduce acoustic noise, as well as improve heat transfer between the PCB and the shield 142.

In one aspect, the third pad 146 and the bonding surface of the shield 142 may each have an area that exceeds the area of the first pad 144 and the second pad 145. In another aspect, the third pad 146 and the bonding surface of the shield 142 may each have an area that occupies physical space between the first pad 144 and the second pad 145. In yet another aspect, the third pad 146 and the bonding surface of the shield 142 may each have an area that extends across a first width w1 of the first and second inductors, 140A and 140B respectively. In yet another aspect, the third pad 146 and the bonding surface of the shield 142 may each have an area that extends across a second width w2 of the first and second inductors, 140A and 140B respectively.

Figure 4:
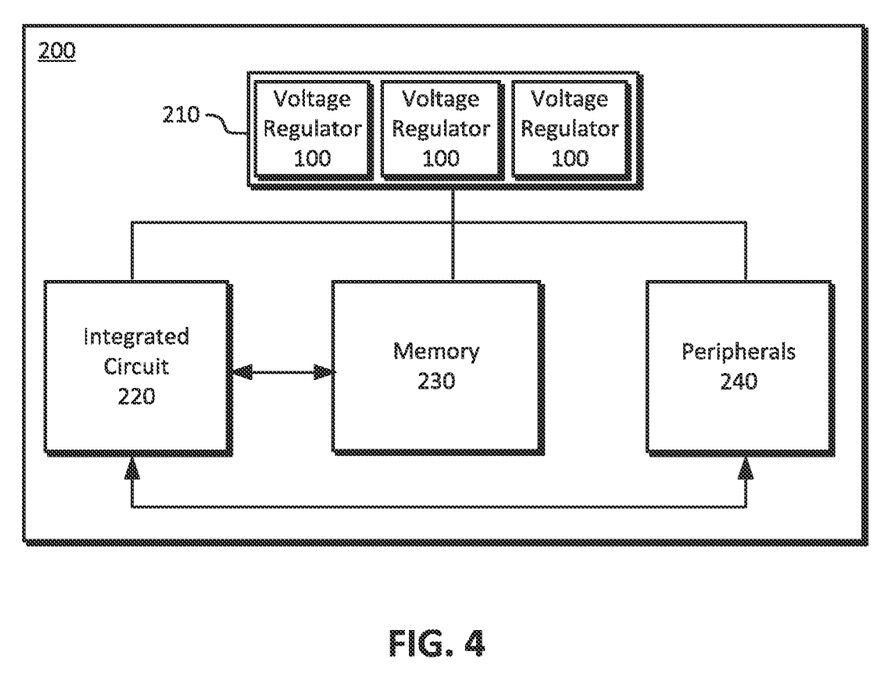
FIG. 4 illustrates a block diagram of an electronic device that includes a plurality of multi-phase voltage regulators, in accordance with various aspects of the subject technology.

FIG. 4 illustrates a block diagram of an electronic device 200 that includes a plurality of multi-phase voltage regulators 100, in accordance with various aspects of the subject technology. The electronic device 200 includes at least one instance of an integrated circuit 220 coupled to external memory 230. The integrated circuit 220 may include a memory controller that is coupled to the external memory 230. The integrated circuit 220 is coupled to one or more peripherals 240 and the external memory 230. A power supply 210 is also provided which supplies the supply voltages to the integrated circuit 220 as well as one or more supply voltages to the memory 230 and/or the peripherals 240. In some embodiments, more than one instance of the integrated circuit 220 may be included (and more than one external memory 230 may be included as well).

The power supply 210 comprises a plurality of DC-DC two-phase voltage regulators 100 (as described above) that are arranged within the electronic device 200 to support the power demands of the electronic device 200, components, and/or peripherals 240. For example, if each phase of the voltage regulator 100 is configured to support 50-60 Amps, each voltage regulator 100 may support 100-110 Amps. Based on the power requirements of the electronic device 200, a number of voltage regulators 100 utilized by the electronic device 200 may be increased to satisfy the power requirements of the electronic device. Specifically, should the electronic device 200 require more than 600 Amps peak current for a graphics processing unit (GPU) or a central processing unit (CPU), eight voltage regulators 100 (16 phases) may be arranged within the electronic device to provide 800-880 Amps. In some aspects, by mirroring the components on each voltage regulator 100 and arranging the components so that they are horizontally symmetrical, as described above, the power supply 210 is capable of providing high-current within a smaller footprint over conventional power supplies (which arrange components side-by-side), while reducing or eliminating electromagnetic noise and/or acoustic noise through cancelation (as described above), and improving thermal performance. In another aspect, each of the plurality of multi-phase voltage regulators 100, during operation, provide current at a common target output voltage to a load.

The peripherals 240 may include any desired circuitry, depending on the type of electronic device 200. For example, in one embodiment, the electronic device 200 may be a mobile device (e.g. personal digital assistant (PDA), tablet, laptop, smart phone, etc.) and the peripherals 240 may include devices for various types of wireless communication, such as WiFi, Bluetooth, cellular, global positioning system, etc. The peripherals 240 may also include additional storage, including RAM storage, solid-state storage, or disk storage. The peripherals 240 may include user interface devices such as a display screen, including touch display screens or multitouch display screens, keyboard or other input devices, microphones, speakers, etc. In other embodiments, the electronic device 200 may be any type of computing system (e.g. desktop personal computer, workstation, watch, wearable device, and/or other type of computing system).

The external memory 230 may include any type of memory. For example, the external memory 230 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 230 may include one or more memory modules to which the memory devices are mounted, such as single inline memory modules (SIMMs), dual inline memory modules (DIMMs), etc.

Figure 5:
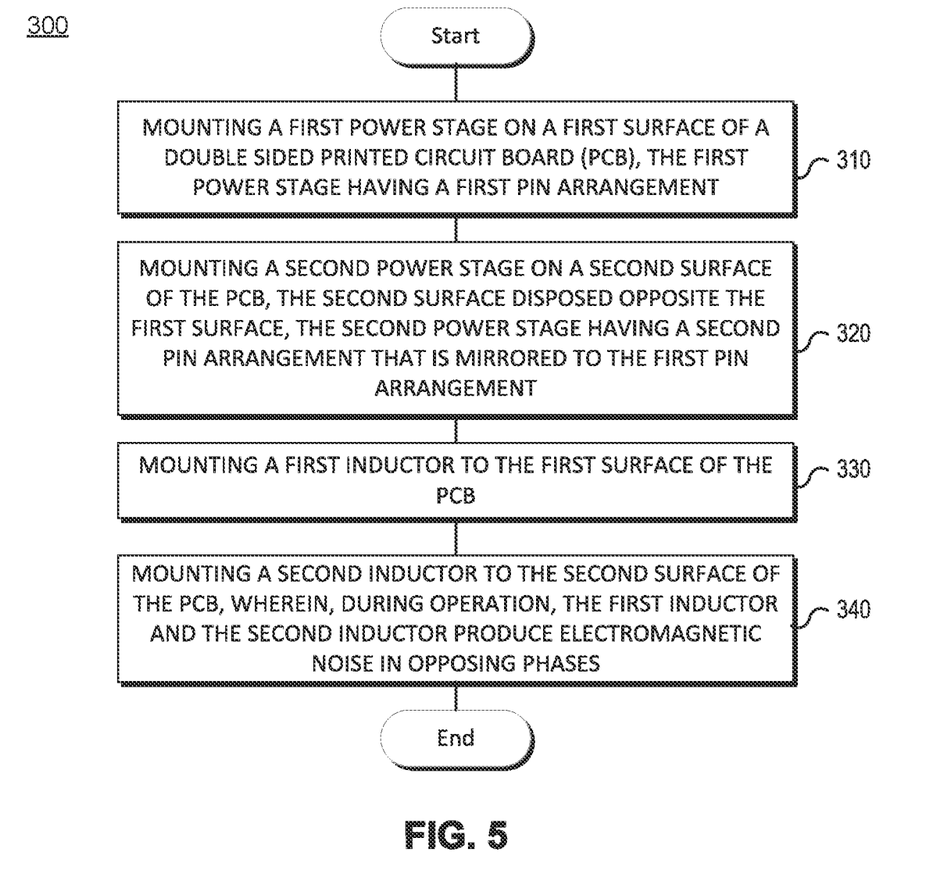
FIG. 5 illustrates an exemplary method for increasing a power density of a power-supply circuit, in accordance with various aspects of the subject technology.

FIG. 5 illustrates an exemplary method 300 for increasing a power density of a power-supply circuit, in accordance with various aspects of the subject technology. It should be understood that, for any process discussed herein, there can be additional, fewer, or alternative steps performed in similar or alternative orders, or in parallel, within the scope of the various embodiments unless otherwise stated.

At operation 310, a first power stage is mounted on a first surface of a double-sided PCB. The first power stage has a first pin arrangement. At operation 320, a second power stage is mounted on a second surface of the PCB. The second surface of the PCB is disposed opposite the first surface. The second power stage has a second pin arrangement that is mirrored to the first pin arrangement. Each of the first and second power stages may comprise IC having an HS MOSFET, an LS MOSFET, and a driver. At operation

330, a first inductor is mounted to the first surface of the PCB. At operation 340, a second inductor is mounted to the second surface of the PCB. A first set of capacitors may be mounted to the first surface of the PCB and a second set of capacitors may be mounted to the second surface of the PCB.

An outer shield may surround each of the first and second inductors to transfer heat away from the PCB. A bonding surface disposed on a bottom portion of the shield may be soldered to the PCB. The bonding surface may have an enlarged area, compared to other terminals extending from the inductors, to improve heat transfer between the PCB and the inductor, and to further dampen acoustic noise or vibration generated by each inductor. By increasing an area that is soldered and mechanically coupled to the PCB, the inductor is physically stabilized such that any vibration or acoustic noise generated by the inductor is more efficiently transferred to the PCB for dampening. The bonding surface, as described above, may have an area that extends across a width of the inductor. During operation, the first inductor and the second inductor produce electromagnetic noise in opposing phases to thereby cancel any electromagnetic noise generated by each respective inductor.

In some aspects, the power supply circuit comprises a two phase voltage regulator. A first phase of the two-phase voltage regulator may comprise the first set of capacitors, the first power stage, and the first inductor. A second phase of the two-phase voltage regulator may comprise the second set of capacitors, the second power stage, and the second inductor. By arranging the components of the voltage regulator so that each component is mirrored on a top and bottom surface of the PCB, electromagnetic noise generated in the first phase, is effectively canceled by electromagnetic noise generated in the second phase. Specifically, because each phase carries the same current, but in opposing directions, the electromagnetic moments generated by the first phase and second phase cancel each other out. In another aspect, acoustic noise generated by the inductors is canceled because the inductors are mounted in a mirrored configuration that is symmetrical about a horizontal plane. Specifically, because the first inductor and the second inductor operate in opposing phases, acoustic noise or vibration is canceled.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A power-supply circuit, comprising:
    a double-sided printed circuit board (PCB) comprising a first surface and a second surface, the second surface disposed opposite the first surface;
    a first power stage mounted to the first surface of the PCB;
    a second power stage mounted to the second surface of the PCB and disposed opposite the first power stage;
    a first inductor mounted to the first surface of the PCB; and
    a second inductor mounted to the second surface of the PCB and disposed opposite the first inductor, wherein during operation, the first inductor and the second inductor produce electromagnetic noise in opposing phases;
    wherein each of the first and second inductors are at least partially surrounded by an outer shield that transfers heat away from the PCB, and
    wherein the shield comprises a bonding surface disposed on a bottom portion of the shield, the bonding surface having an area extends across a width of the first and second inductors, respectively, for mounting to the PCB.

2. The power-supply circuit of claim 1, further comprising:
    a first capacitor mounted to the first surface of the PCB; and
    a second capacitor mounted to the second surface of the PCB and disposed opposite the first capacitor.

3. The power-supply circuit of claim 1, wherein each of the first and second power stages comprise an HS MOSFET, an LS MOSFET, and a driver.

4. The power-supply circuit of claim 1, wherein a pin arrangement of the second power stage is mirrored to a pin arrangement of the first power stage.

5. The power-supply circuit of claim 1, wherein a conductive pattern disposed on the second surface of the PCB is mirrored to a conductive pattern disposed on the first surface of the PCB.

6. An electronic device, comprising:
    a plurality of multi-phase voltage regulators, each voltage regulator comprising:
    a double-sided printed circuit board (PCB) comprising a first surface and a second surface, the second surface disposed opposite the first surface;
    a first power stage mounted to the first surface of the PCB;
    a second power stage mounted to the second surface of the PCB and disposed opposite the first power stage;
    a first inductor mounted to the first surface of the PCB;
    a second inductor mounted to the second surface of the PCB and disposed opposite the first inductor, wherein during operation, the first inductor and the second inductor produce electromagnetic noise in opposing phases;
    wherein each of the first and second inductors are at least partially surrounded by an outer shield that transfers heat away from the PCB;
    wherein the shield comprises a bonding surface disposed on a bottom portion of the shield, the bonding surface having an area extends across a width of the first and second inductors, respectively, for mounting to the PCB; and
    wherein each of the plurality of multi-phase voltage regulators, during operation, provide current at a common target output voltage to a load.

7. The electronic device of claim 6, wherein each voltage regulator further comprises:
    a first capacitor mounted to the first surface of the PCB; and
    a second capacitor mounted to the second surface of the PCB and disposed opposite the first capacitor.

8. The electronic device of claim 6, wherein each of the first and second power stages comprise an HS MOSFET, an LS MOSFET, and a driver.

9. The electronic device of claim 6, wherein a pin arrangement of the second power stage is mirrored to a pin arrangement of the first power stage.

10. The electronic device of claim 6, wherein a conductive pattern disposed on the second surface of the PCB is mirrored to a conductive pattern disposed on the first surface of the PCB.

11. A method for increasing a power density of a power-supply circuit, the method comprising:

mounting a first power stage on a first surface of a double-sided printed circuit board (PCB), the first power stage having a first pin arrangement;

mounting a second power stage on a second surface of the PCB, the second surface disposed opposite the first surface, the second power stage having a second pin arrangement that is mirrored to the first pin arrangement;

mounting a first inductor to the first surface of the PCB;

mounting a second inductor to the second surface of the PCB, wherein, during operation, the first inductor and the second inductor produce electromagnetic noise in opposing phases; and at least partially surrounding each of the first and second inductors by an outer shield that transfers heat away from the PCB, and further comprising soldering a bonding surface of the shield to the PCB, wherein the bonding surface has an area that extends across a width of the first and second inductors, respectively.

12. The method of claim 11, further comprising:

mounting a first capacitor to the first surface of the PCB; and mounting a second capacitor to the second surface of the PCB.

13. The method of claim 11, wherein each of the first and second power stages comprise an HS MOSFET, an LS MOSFET, and a driver.

14. The method of claim 11, wherein a conductive pattern disposed on the second surface of the PCB is mirrored to a conductive pattern disposed on the first surface of the PCB.

* * * * *